(12) United States Patent
Nagler et al.

(10) Patent No.: US 12,222,322 B2
(45) Date of Patent: Feb. 11, 2025

(54) SYSTEM AND METHOD FOR THE ACOUSTIC DETECTION OF CRACKS IN A SEMICONDUCTOR SUBSTRATE

(71) Applicant: Infineon Technologies AG, Neubiberg (DE)

(72) Inventors: Oliver Nagler, Munich (DE); Marianne Unterreitmeier, Woerth (DE)

(73) Assignee: Infineon Technologies AG, Neubiberg (DE)

( * ) Notice: Subject to any disclaimer, the term of this patent is extended or adjusted under 35 U.S.C. 154(b) by 712 days.

(21) Appl. No.: 17/401,380

(22) Filed: Aug. 13, 2021

(65) Prior Publication Data

US 2022/0050083 A1 Feb. 17, 2022

(30) Foreign Application Priority Data

Aug. 14, 2020 (DE) ...................... 10 2020 121 427.8

(51) Int. Cl.
*G01N 29/04* (2006.01)
*H01L 21/66* (2006.01)
*G01N 29/12* (2006.01)

(52) U.S. Cl.
CPC ........... *G01N 29/045* (2013.01); *H01L 22/12* (2013.01); *G01N 29/12* (2013.01); *G01N 2291/014* (2013.01); *G01N 2291/023* (2013.01)

(58) Field of Classification Search
CPC ................. G01N 29/045; G01N 29/12; G01N 2291/014; G01N 2291/023; H01L 22/12

USPC ........... 324/500, 76.11, 600, 762.05; 73/599; 438/14; 702/82
See application file for complete search history.

(56) References Cited

U.S. PATENT DOCUMENTS

| 10,859,534 | B2 | 12/2020 | Nagler et al. | |
| 11,923,247 | B2* | 3/2024 | Yeom | H01L 23/562 |
| 2010/0039128 | A1* | 2/2010 | Nitsch | H01L 22/12 |
| | | | | 324/762.05 |
| 2019/0257793 | A1 | 8/2019 | Yazzie et al. | |
| 2021/0356435 | A1* | 11/2021 | Pantea | G01N 29/225 |
| 2023/0055550 | A1* | 2/2023 | Kim | G01N 29/0654 |
| 2023/0417696 | A1* | 12/2023 | Kim | H01L 23/5228 |

FOREIGN PATENT DOCUMENTS

| DE | 10 2017 222 198 | | 6/2019 | |
| JP | 2004233304 | * | 8/2004 | G01N 3/00 |

* cited by examiner

*Primary Examiner* — Huy Q Phan
*Assistant Examiner* — Trung Q Nguyen
(74) *Attorney, Agent, or Firm* — Dicke, Billig & Czaja, PLLC

(57) ABSTRACT

A system and method for the acoustic detection of cracks in a semiconductor substrate is disclosed. In one example, the system includes a force generating unit configured to apply a force onto the semiconductor substrate, a detector unit comprising a resonating indenter and an acoustic emission sensor coupled to the resonating indenter, and an evaluation unit configured to evaluate acoustic signals detected by the detector unit and configured to determine whether a crack has occurred based on the detected signals. The resonating indenter is configured to contact the semiconductor substrate at a lateral distance from the force generating unit, and wherein the force generating unit and the resonating indenter are configured to contact the semiconductor substrate on the same side.

18 Claims, 5 Drawing Sheets

SYSTEM AND METHOD FOR THE ACOUSTIC DETECTION OF CRACKS IN A SEMICONDUCTOR SUBSTRATE

CROSS-REFERENCE TO RELATED APPLICATION

This Utility Patent Application claims priority to German Patent Application No. 10 2020 121 427.8, filed Aug. 14, 2020, which is incorporated herein by reference.

TECHNICAL FIELD

This disclosure relates in general to a system for the acoustic detection of cracks or plastic deformation in a semiconductor substrate caused by mechanical stress and to a method for the acoustic detection of cracks in a semiconductor substrate.

BACKGROUND

The fabrication of semiconductor devices may comprise exerting pressure onto a semiconductor substrate. For example, circuits comprised in the semiconductor substrate may need to undergo an electrical functionality test in order to check for damaged devices. Other examples of pressure being exercised onto a semiconductor substrate are wire bonding or dicing of the substrate in order to singulate the semiconductor devices. However, all these acts may potentially damage or irreversibly deform the semiconductor substrate if the exercised pressure is too high. In this case, one or more cracks or deformations in the semiconductor substrate may be caused which may impair the electrical functionality of the affected semiconductor device(s). It may therefore be beneficial to be able to detect such cracks or deformations, ideally in a fast and cost efficient way. Improved systems and methods for the acoustic detection of cracks or deformations in a semiconductor substrate may help with solving these and other problems.

The problem on which the invention is based is solved by the features of the independent claims. Further advantageous examples are described in the dependent claims.

SUMMARY

Various aspects pertain to a system for the acoustic detection of cracks in a semiconductor substrate, the system comprising: a force generating unit configured to press down onto a semiconductor substrate and thereby apply a force onto the semiconductor substrate, a detector unit comprising a resonating indenter and an acoustic emission sensor coupled to the resonating indenter, and an evaluation unit configured to evaluate acoustic signals detected by the detector unit and configured to determine, whether a crack or an irreversible deformation has occurred based on the detected signals, wherein the resonating indenter is configured to contact the semiconductor substrate at a lateral distance from the force generating unit, and wherein the force generating unit and the resonating indenter are configured to contact the semiconductor substrate on the same side.

Various aspects pertain to a method for the acoustic detection of cracks in a semiconductor substrate, the method comprising: pressing down onto a semiconductor substrate with a force generating unit and thereby applying a force onto the semiconductor substrate, contacting the semiconductor substrate with a resonating indenter of a detector unit, the detector unit further comprising an acoustic emission sensor coupled to the resonating indenter, and evaluating with an evaluation unit acoustic signals detected by the detector unit and determining, whether a crack has occurred based on the detected signals, wherein the resonating indenter is configured to contact the semiconductor substrate at a lateral distance from the force generating unit, and wherein the force generating unit and the resonating indenter are configured to contact the semiconductor substrate on the same side.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The semiconductor substrate mentioned further below may be manufactured by different technologies and may include for example integrated electrical, electro-optical or electro-mechanical circuits and/or passives, logic integrated circuits, control circuits, microprocessors, memory devices, etc. The semiconductor substrate may have contact pads (or electrodes) which allow electrical contact to be made with the integrated circuits of semiconductor devices included in the semiconductor substrate. The electrodes may be arranged all at only one main side of the semiconductor substrate or at both main sides of the semiconductor substrate. The semiconductor substrate may be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals. The semiconductor substrate may e.g. comprise or consist of a semiconductor wafer, a compound wafer, a panel, or a singulated semiconductor die.

Figure 1:
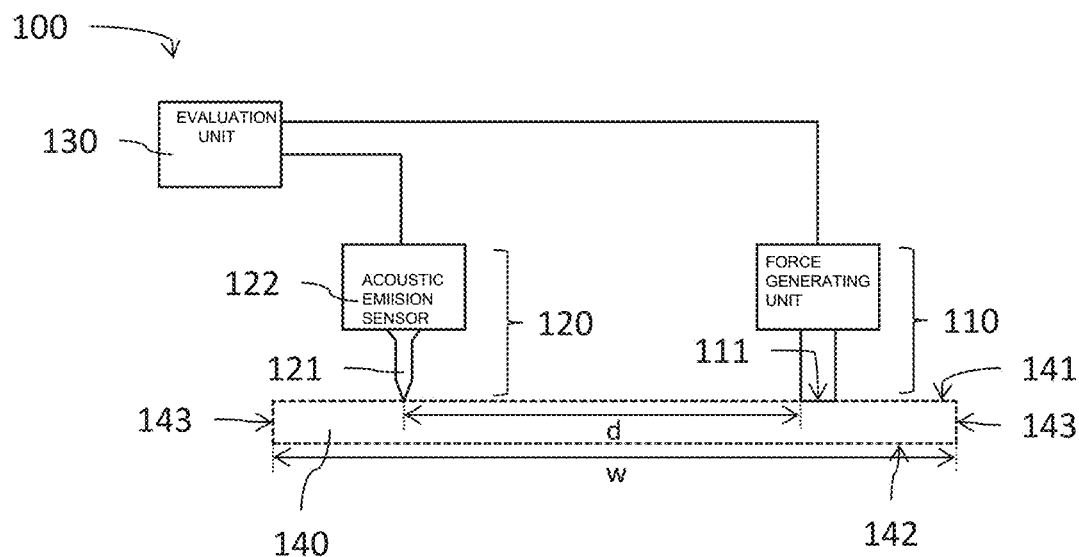
FIG. 1 shows a schematic side view of a system for the acoustic detection of cracks in a semiconductor substrate.

FIG. 1 shows a system 100 for the acoustic detection of cracks in a semiconductor substrate. The system 100 comprises a force generating unit 110, a detector unit 120, and an evaluation unit 130.

The force generating unit 110 is configured to press down onto a semiconductor substrate 140 (which is not part of system 100 and is therefore indicated by dashed lines in FIG. 1) and thereby apply a force onto the semiconductor substrate 140. The force generating unit 110 may for example be configured to apply a force of 100 mN or more, 200 mN or more, 500 mN or more, 1000 mN or more, or 2000 mN or more.

The detector unit 120 comprises a resonating indenter 121 and an acoustic emission sensor 122 coupled to the resonating indenter 121. The acoustic emission sensor 122 may e.g. be a piezoelectric acoustic emission sensor. The resonating indenter 121 may e.g. be coupled to a detector surface of the acoustic emission sensor 122 using a hard glue layer, a soft solder layer, or mechanical fixing means. The resonating indenter 121 may e.g. be a probe pin. The resonating indenter 121 may comprise a tapered tip that is configured to contact the semiconductor substrate 140. The resonating indenter 121 may be configured to transmit acoustic signals from the semiconductor substrate 140 into the acoustic emission sensor 122.

The resonating indenter 121 is configured to contact the semiconductor substrate 140 at a lateral distance d from the force generating unit 110. The lateral distance d may for example be 0.5 cm or more, or 1 cm or more, or 2 cm or more, or 5 cm or more, or 10 cm or more. The lateral distance may e.g. be more than 20% of a width w of the semiconductor substrate 140, or more than 30%, or more than 50%, or more than 70%.

The force generating unit 110 and the resonating indenter 121 are configured to contact the semiconductor substrate 140 on the same side. For example, the semiconductor substrate 140 may comprise a first main side 141, an opposing second main side 142 and lateral sides 143 connecting the first and second main sides 141, 142. The force generating unit 110 and the resonating indenter 121 may both be configured to contact the first main side 141. The semiconductor substrate 140 may for example be arranged on a temporary carrier (e.g. a wafer chuck or a tape) during acoustic detection of cracks by the system 100, wherein the second main side 142 faces the temporary carrier.

The evaluation unit 130 is configured to evaluate acoustic signals detected by the detector unit 120 and it is configured to determine whether a crack has occurred in the semiconductor substrate 140 based on the detected signals. Such a crack may for example occur due to mechanical stress caused by the force generating unit 110.

According to an example, the downward pressure exercised by the force generating unit 110 is only a byproduct of some process step during semiconductor device fabrication, e.g. electrical testing, wire bonding, dicing, or molding.

For example, the semiconductor substrate 140 may comprise a plurality of semiconductor devices (e.g. transistor circuits) and during fabrication the electrical functionality of these devices is tested. In this case, the force generating unit 110 may comprise a probe card of a testing equipment for electrical testing. Such a probe card may comprise testing pins which are brought into contact with contact pads of the semiconductor devices in the semiconductor substrate 140. The testing pins may exert a force onto the semiconductor substrate 140, which may cause a crack (and therefore damage one or more of the semiconductor devices).

According to another example, the force generating unit 110 comprises a bondhead of a wire bonding equipment which is used for attaching bond wires to semiconductor devices in the semiconductor substrate 140. According to yet another example, the force generating unit 110 comprises a saw of a dicing equipment which is used for sawing through kerfs in the semiconductor substrate 140.

In each of the above-mentioned examples, it may be desirable to detect cracks in the semiconductor substrate 140, for example in order to discard damaged semiconductor devices.

The force generating unit 110 may comprise a contact area 111, wherein the contact area 111 is configured to contact the first main side 141 of the semiconductor substrate 140. The contact area 111 may for example comprise the tips of testing pins, the bondhead of a wire bonder, or the cutting edge of a saw. The contact area 111 may have any suitable size, for example a size of 300 $\mu m^2$ or more, or 1 $mm^2$ or more, or 1 $cm^2$ or more. The contact area 111 may be configured to cover only a small part of the first main side 141 of the semiconductor substrate 140, e.g. 20% or less, or 10% or less, or 5% or less.

The force generating unit 110 may be configured to contact only specific parts of the first main side 141 of the semiconductor substrate. For example, in the case that the force generating unit 110 comprises a probe card of a testing equipment for electrical testing or a bondhead of a wire bonding equipment, the force generating unit 110 may be configured to solely touch contact pads on the first main side 141 but no other part of the first main side 141. In the case that the force generating unit 110 comprises a saw of a dicing equipment, the force generating unit 110 may be configured to solely touch kerfs on the first main side 141 but no other part of the first main side 141.

The force generating unit 110 may be configured to exert a pressure onto a given semiconductor substrate 140 only once or to exert a pressure repeatedly. The force generating unit 140 may be configured to exert the pressure for any suitable timespan, e.g. a fraction of a second, or one second or more, or several seconds or more.

The detector unit 120 may comprise a single resonating indenter 121 and a single acoustic emission sensor 122. Alternatively, it may comprise several resonating indenters 121 and/or several acoustic emission sensors.

According to an example, the resonating indenter 121 has a first resonance frequency and the acoustic emission sensor 122 has a second resonance frequency, wherein the first and second resonance frequencies are attuned to one another such that an optimal sensitivity of the detector unit 120 to cracks in the semiconductor substrate 140 is ensured. The first and second resonance frequencies may for example be in the range of 100 kHz to 1 MHz, in particular in the range of 100 kHz to 200 kHz. The detector unit 120 may for example be sensitive to acoustic signals in the range of 50 kHz to 1 MHz. The detector unit 120 may e.g. be sensitive to acoustic signals with peak amplitudes of 10 dBAE or more, or 20 dBAE or more.

The evaluation unit 130 may e.g. comprise evaluation electronics configured to evaluate acoustic signals detected by the detector unit 120. The evaluation unit 130 may be configured to inform a user of the fact that a crack was detected in the semiconductor substrate 140 and/or it may be configured to pass on this information to other automated equipment, e.g. for automatically discarding damaged semiconductor devices.

The evaluation unit 130 may be coupled to the detector unit 120 (e.g. to an output of the detector unit 120) and it may also be coupled to the force generating unit 110. A coupling between the evaluation unit 130 and the force generating unit 110 may e.g. be used to inform the evaluation unit 130 that the force generating unit 110 is lowered down to touch the semiconductor substrate 140 or that the force generating unit 110 is raised back up. This may e.g. be useful for detecting acoustic signals in a time-synchronous manner with a contact force exerted by the force generating unit 110.

The system 100 may further comprise an amplifier for amplifying signals detected by the detector unit 120. The amplifier may for example be comprised in the detector unit 120 or in the evaluation unit 130. The system 100 may comprise a convertor for converting an analog signal into a digital signal for evaluation.

Figure 2:
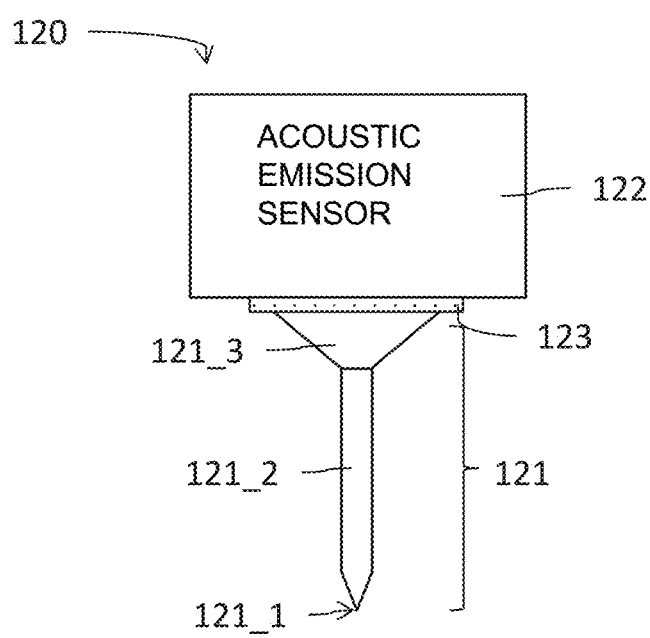
FIG. 2 shows a schematic side view of a detector unit which may be used in the system of FIG. 1

FIG. 2 shows the detector unit 120 according to an example. In the example of FIG. 2, the resonating indenter 121 comprises a tip 121_1, a shaft 121_2 and a base 121_3, wherein the base 121_3 has a larger diameter than the shaft 121_2. According to an example, an adhesive layer 123 may be used to attach the resonating indenter 121 to the acoustic emission sensor 122.

The resonating indenter 121 may comprise or consist of any suitable material, e.g. Cu, Rh, W, or steel. The resonating indenter 121 may essentially be rigid. The tip 121_1 may e.g. comprise or consist of diamond. The tip 121_1 may e.g. have an essentially rounded shape or a tapered shape. The tip 121_1 may e.g. have a diameter of 10 μm or more, or 20 μm or more. The resonating indenter 121 may have a length measured between the tip 121_1 and the adhesive layer 123 of less than 10 mm, or 10 mm or more, or 20 mm or more. The shaft 121_2 may have any suitable diameter, e.g. a diameter in the range of 0.8 mm to 1.5 mm.

The adhesive layer 123 may be a "hard" layer, meaning that it is dimensionally stable and inelastic. Due to these properties, the adhesive layer 123 may be a good transmitter for acoustic signals. According to an example, the adhesive layer 123 comprises or consists of cyanoacrylate.

Figure 3:
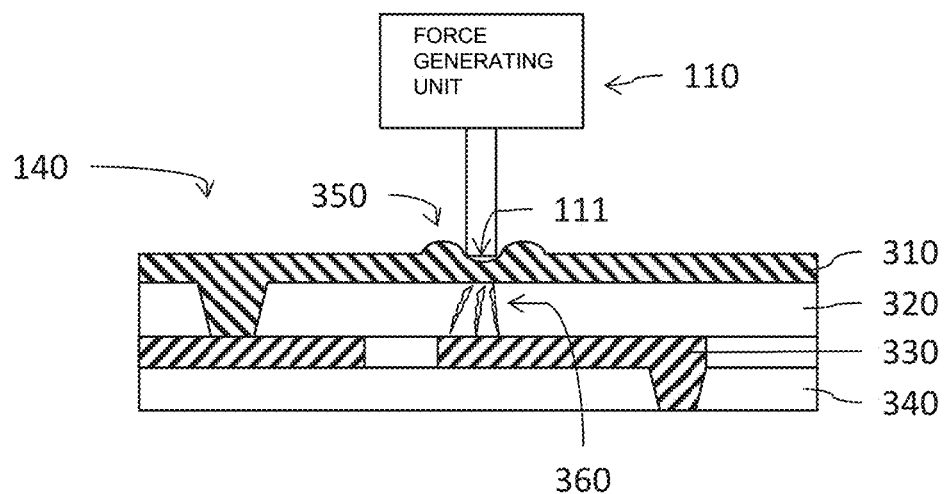
FIG. 3 shows a schematic sectional view of a semiconductor substrate comprising a plastic deformation and a crack due to a pressure exercised onto the semiconductor substrate.

FIG. 3 shows the semiconductor substrate 140 according to an example. As shown in FIG. 3, the semiconductor substrate 140 may comprise a layer stack. The layer stack may e.g. comprise one or more of a first metal layer 310, an oxide layer 320, a second metal layer 330, and another isolating layer or gate oxide layer 340.

The first metal layer 310 may e.g. comprise or consist of Al and/or Cu. The first metal layer 310 may comprise contact pads of semiconductor devices comprises in the semiconductor substrate 140.

The oxide layer 320 may e.g. comprise a silicon oxide. The oxide layer 320 may be arranged under the first metal layer 310.

The second metal layer 330 may e.g. comprise or consist of Cu. The second metal layer 330 may e.g. be an electrical redistribution layer and it may be electrically coupled to the first metal layer 310. The second metal layer 330 may be arranged under the oxide layer 320 or embedded within the oxide layer 320.

The isolating layer 340 may e.g. comprise an oxide material. Another isolating layer or gate oxide layer 340 may be arranged under the second metal layer 330 or the second metal layer 330 may be embedded within the isolating layer 340.

As shown in FIG. 3, the contact area 111 of the force generating unit 110 may be brought into contact with the semiconductor substrate 140, e.g. with the first metal layer 310. The force generating unit 110 may exert a pressure onto the semiconductor substrate 140 which may cause a plastic deformation 350 and/or a crack 360 in the semiconductor substrate 140. A plastic deformation 350 and/or a crack 360 may for example occur if the force generating unit 110 was lowered down onto the semiconductor substrate 140 with too much force.

The plastic deformation 350 may for example occur in the first metal layer 310. The first metal layer 310 may be at least somewhat malleable and may therefore not be prone to crack. The crack 360 may for example occur in the oxide layer 320 (as shown in FIG. 3), or in the dielectric layer 340. The oxide layer 320 and/or the dielectric layer 340 may be brittle and may therefore be prone to crack when the force generating unit 110 exerts too much force onto the semiconductor substrate 140. A crack 360 may for example have a size of about 1 μm or less up to about 10 μm.

The crack 360 may reduce the ability of the oxide layer 320 to act as an electrical insulator and may therefore cause an electrical failure. The crack 360 may occur directly under the contact area 111 as shown in FIG. 3 or it may occur somewhere else within the semiconductor substrate 140. Generally speaking, cracks and plastic deformations in the semiconductor substrate 140 may cause damage to insulating layers. Such damage may cause electrical failures during operation, for example leakage currents and/or electrical shorts.

The plastic deformation 350 may cause an acoustic signal with a comparatively small peak amplitude. The plastic deformation 350 may in particular cause an acoustic signal which is not readily transmitted across the semiconductor substrate 140, e.g. due to attenuation within the semiconductor substrate 140. For example, after having traversed the distance d between the force generating unit 110 (i.e. the site of the plastic deformation 350) and the detector unit 120, an acoustic signal caused by the plastic deformation 350 may be attenuated to such a degree that the detector unit 120 is unable to detect it. On the other hand, an acoustic signal caused by the crack 360 may have a comparatively large peak amplitude and may in particular be readily transmitted across the semiconductor substrate 140. After traversing the distance d, an acoustic signal caused by the crack 360 may therefore be readily detectable by the detector unit 120.

For this reason, it may be possible to distinguish a crack from a plastic deformation using the system 100. By properly setting the distance d and/or a sensitivity of the detector unit 120, the system 100 only detects acoustic signals caused by cracks. A proper value for the distance d for this purpose may for example be about 1 cm or more, or 5 cm or more, or 8 cm or more, or 10 cm or more, depending on the specific semiconductor substrate 140 and/or the sensitivity of the detector unit 120.

Figure 4A:
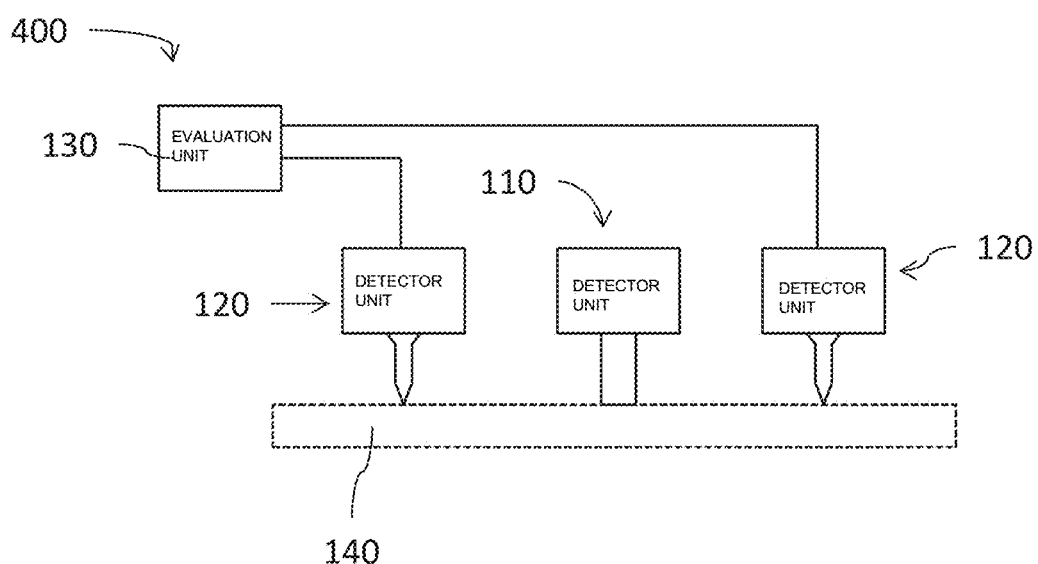
FIGS. 4A and 4B show a schematic side view and top-down view of a further system for the acoustic detection of cracks in a semiconductor substrate.
Figure 4B:
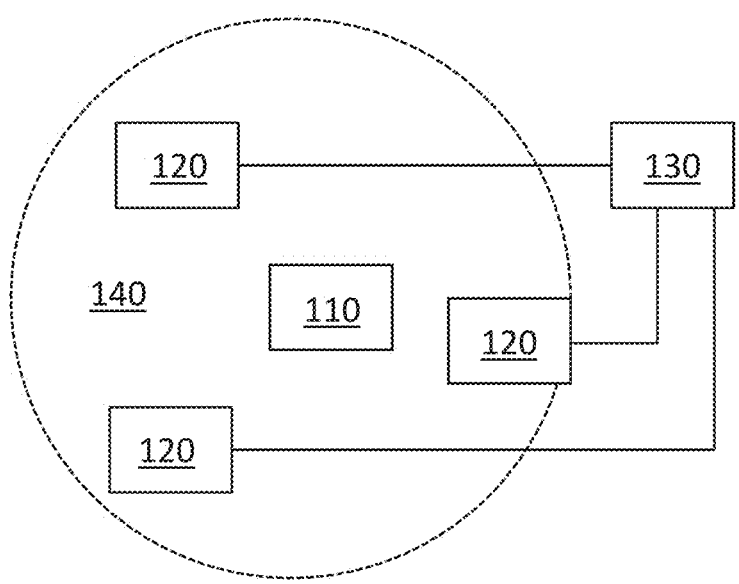

FIGS. 4A and 4B show a further system 400 for the acoustic detection of cracks in a semiconductor substrate. The system 400 may be similar to or identical with the system 100, except that it comprises several detector units 120 instead of a single one. FIG. 4A shows a side view and FIG. 4B shows a top-down view.

The system 400 may be configured to determine the location at which a crack has occurred in the semiconductor substrate 140. The location of a crack may for example be determined by analyzing the times at which an acoustic signal is detected by individual detector units 120 that are arranged at a distance to one another. Thereby, the distances between the individual detector units 120 and the crack may be determined. The system 400 may for example comprise at least three detector units 120 in order to precisely locate cracks in the semiconductor substrate 140. The individual detector units 120 may be coupled to a common evaluation unit 130.

The individual detector units 120 may for example be arranged around the force generating unit 110, as shown in FIG. 4B. However, the individual detector units 120 may e.g. also be arranged on one side of the force generating unit 110. The individual detector units 120 may be arranged in any pattern suitable for the localization of cracks.

According to another example, the system 400 does not comprise more than one detector unit 120, but instead the single detector unit 120 comprises several acoustic emission sensors 122 and several resonating indenters 121, wherein each resonating indenter 121 is coupled to a different acoustic emission sensor 122.

Figure 5A:
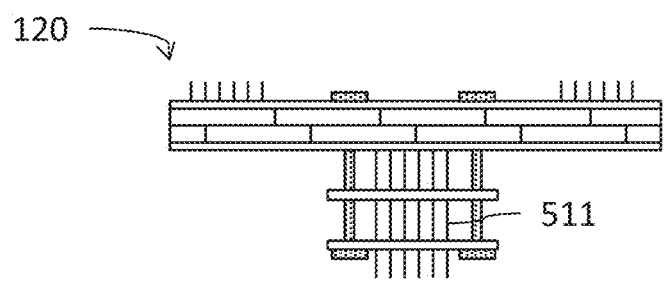
FIGS. 5A to 5C show different examples of force generating units which may be used in the systems of FIGS. 1 and 4.
Figure 5B:
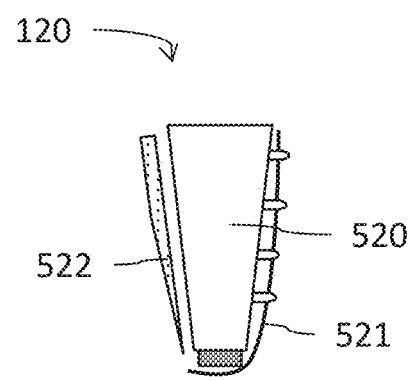
Figure 5C:
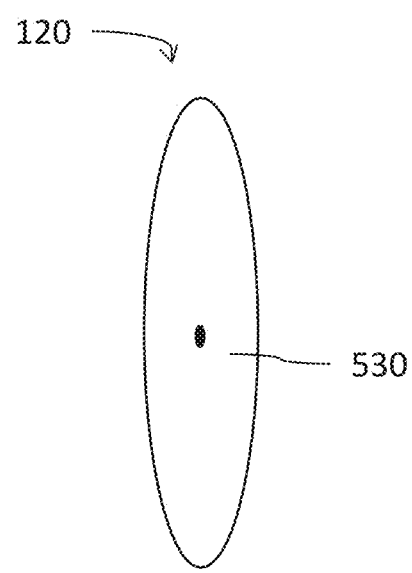

FIGS. 5A to 5C show different examples for the force generating unit 110 which may be used in the systems 100 and 400.

FIG. 5A shows the force generating unit 110 to comprise a probe card 510 of a testing equipment for electrical testing. The probe card 510 comprises a plurality of testing pins 511 for electrically contacting semiconductor devices in the semiconductor substrate 140. The tips of the testing pins 511 form the contact area 111.

FIG. 5B shows the force generating unit 110 to comprise a bondhead 520 of a wire bonding equipment. The contact area 111 may e.g. be formed by the tip of the bondhead 520, by bond wire 521, or by cutting edge 522.

FIG. 5C shows the force generating unit 110 to comprise a saw 530 of a dicing equipment. The contact area 111 may be formed by the edge of the saw 530.

Figure 6:
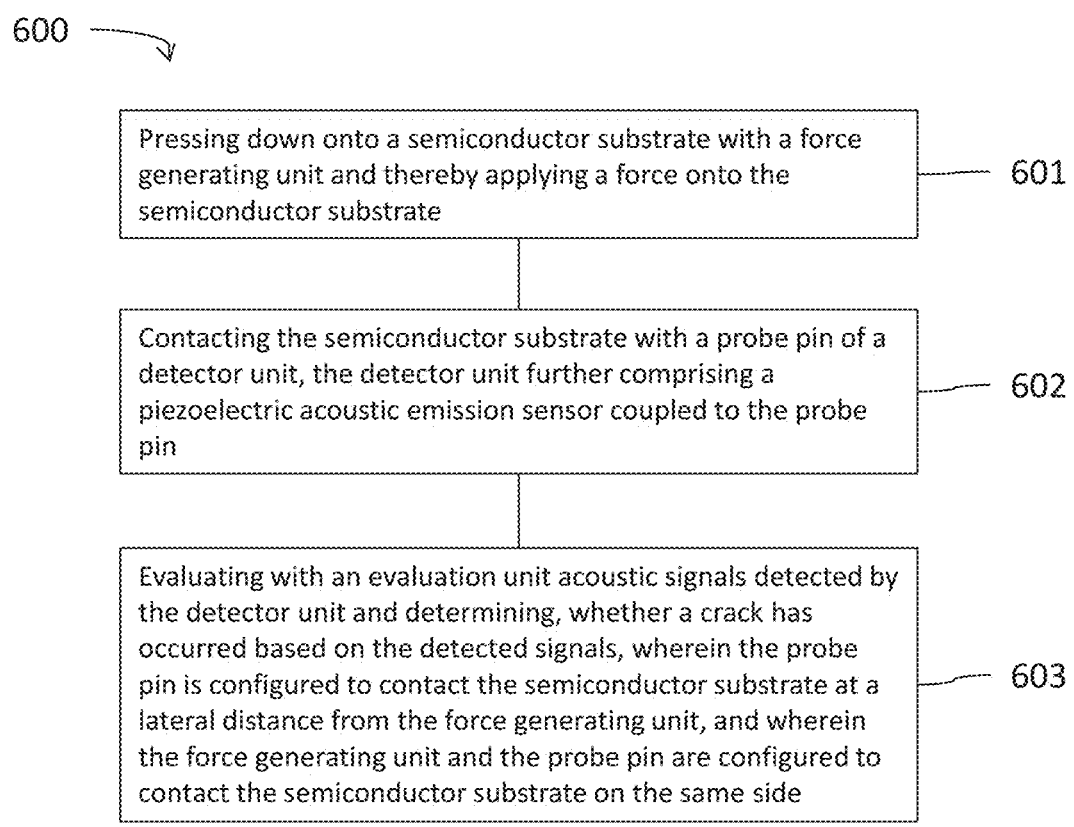
FIG. 6 is a flow chart of a method for the acoustic detection of cracks in a semiconductor substrate.

FIG. 6 is a flow chart of a method 600 for the acoustic detection of cracks in a semiconductor substrate. The method 600 may for example be performed using the system 100 or 400.

The method 600 comprises at 601 an act of pressing down onto a semiconductor substrate with a force generating unit and thereby applying a force onto the semiconductor substrate, at 602 an act of contacting the semiconductor substrate with a resonating indenter of a detector unit, the detector unit further comprising a acoustic emission sensor coupled to the resonating indenter, and at 603 an act of evaluating with an evaluation unit acoustic signals detected by the detector unit and determining, whether a crack has occurred based on the detected signals, wherein the resonating indenter is configured to contact the semiconductor substrate at a lateral distance from the force generating unit, and wherein the force generating unit and the resonating indenter are configured to contact the semiconductor substrate on the same side.

According to an example, the method 600 is performed during electrical testing of the semiconductor substrate (i.e. electrical testing of e.g. transistor circuits in the semiconductor substrate), or during wire bonding, or during dicing. According to an example, the method 600 further comprises an act of determining the location of a crack in the semiconductor substrate by using more than one detector units, wherein the more than one detector units contact the semiconductor substrate at different locations. Furthermore, the method 600 may comprise determining in which semiconductor device of a plurality of semiconductor devices comprised in the semiconductor substrate the crack occurred.

EXAMPLES

In the following, the system and method for the acoustic detection of cracks in a semiconductor substrate are further explained using specific examples.

Example 1 is a system for the acoustic detection of cracks in a semiconductor substrate, the system comprising: a force generating unit configured to press down onto a semiconductor substrate and thereby apply a force onto the semiconductor substrate, a detector unit comprising a resonating indenter and an acoustic emission sensor coupled to the resonating indenter, and an evaluation unit configured to evaluate acoustic signals detected by the detector unit and configured to determine, whether a crack has occurred based on the detected signals, wherein the resonating indenter is configured to contact the semiconductor substrate at a lateral distance from the force generating unit, and wherein the force generating unit and the resonating indenter are configured to contact the semiconductor substrate on the same side.

Example 2 is the system of example 1, wherein the force generating unit comprises a probe card of a testing equipment for electrical testing, or a bondhead of a wire bonding equipment, or a saw of a dicing equipment.

Example 3 is the system of example 1 or 2, further comprising: one or more additional detector units, wherein the resonating indenters of the detector units are configured to contact the semiconductor substrate at locations that are spaced apart from one another, and wherein the evaluation unit is configured to determine the location at which a crack occurred based on the signals detected by the detector units.

Example 4 is the system of one of the preceding examples, wherein the resonance frequencies of the resonating indenter and the acoustic emission sensor are attuned to one another.

Example 5 is the system of example 4, wherein the resonance frequencies are in the range of 100 kHz to 1 MHz.

Example 6 is the system of one of the preceding examples, wherein the resonating indenter comprises a tip and wherein the tip has a diameter of 20 μm or less.

Example 7 is the system of example 6, wherein the tip comprises diamond.

Example 8 is the system of one of the preceding examples, wherein the resonating indenter has a length of 10 mm or more.

Example 9 is the system of one of the preceding examples, wherein the lateral distance is 1 cm or more.

Example 10 is the system of one of the preceding examples, wherein due to the lateral distance the system is configured to differentiate an acoustic signal generated by a crack in the semiconductor substrate from an acoustic signal generated by a plastic deformation in the semiconductor substrate.

Example 11 is the system of one of the preceding examples, wherein the force generating unit and/or the detector unit are moveable across a plane parallel to the semiconductor substrate.

Example 12 is the system of one of the preceding examples, wherein the detector unit is configured to press the probe tip onto the semiconductor substrate with a force of 1000 mN or less.

Example 13 is a method for the acoustic detection of cracks in a semiconductor substrate, the method comprising: pressing down onto a semiconductor substrate with a force generating unit and thereby applying a force onto the semiconductor substrate, contacting the semiconductor substrate with a resonating indenter of a detector unit, the detector unit further comprising an acoustic emission sensor coupled to the resonating indenter, and evaluating with an evaluation unit acoustic signals detected by the detector unit and determining, whether a crack has occurred based on the detected signals, wherein the resonating indenter is configured to contact the semiconductor substrate at a lateral distance from the force generating unit, and wherein the force generating unit and the resonating indenter are configured to contact the semiconductor substrate on the same side.

Example 14 is the method of example 13, wherein the method is performed during electrical testing of the semiconductor substrate, or during wire bonding, or during dicing.

Example 15 is the method of example 13 or 14, further comprising: determining the location of a crack in the semiconductor substrate by using more than one detector units, wherein the more than one detector units contact the semiconductor substrate at different locations.

Example 16 is the method of example 15, further comprising: determining in which semiconductor device of a plurality of semiconductor devices comprised in the semiconductor substrate the crack occurred.

Example 17 is the method of one of examples 13 to 16, wherein due to the size of the lateral distance, the detector unit is sensitive to acoustic signals of cracks but not to acoustic signals of plastic deformations caused by the force generating unit in the semiconductor substrate.

Example 18 is the method of one of examples 13 to 17, wherein the lateral distance is 1 cm or more.

Example 19 is an apparatus comprising means for performing the method of one of examples 13 to 18.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A system for the acoustic detection of cracks in a semiconductor substrate, the system comprising:
   a force generating unit configured to press down onto a semiconductor substrate and thereby apply a force onto the semiconductor substrate;
   a detector unit separate from the force generating unit and comprising a resonating indenter and an acoustic emission sensor coupled to the resonating indenter; and
   an evaluation unit configured to evaluate acoustic signals detected by the detector unit and configured to determine, whether a crack has occurred based on the detected signals,
   wherein the resonating indenter is configured to contact the semiconductor substrate at a lateral distance from the force generating unit, and
   wherein the force generating unit and the resonating indenter are configured to contact the semiconductor substrate on the same side.

2. The system of claim 1, wherein the force generating unit comprises a probe card of a testing equipment for electrical testing, or a bondhead of a wire bonding equipment, or a saw of a dicing equipment.

3. The system of claim 1, further comprising:
   one or more additional detector units, wherein the resonating indenters of the detector units are configured to contact the semiconductor substrate at locations that are spaced apart from one another, and
   wherein the evaluation unit is configured to determine the location at which a crack occurred based on the signals detected by the detector units.

4. The system of claim 1, wherein the resonance frequencies of the resonating indenter and the acoustic emission sensor are attuned to one another.

5. The system of claim 4, wherein the resonance frequencies are in the range of 100 kHz to 1 MHz.

6. The system of claim 1, wherein the resonating indenter comprises a tip and wherein the tip has a diameter of 20 µm or less.

7. The system of claim 6, wherein the tip comprises diamond.

8. The system of claim 1, wherein the resonating indenter has a length of 10 mm or more.

9. The system of claim 1, wherein the lateral distance is 1 cm or more.

10. The system of claim 1, wherein due to the lateral distance the system is configured to differentiate an acoustic signal generated by a crack in the semiconductor substrate from an acoustic signal generated by a plastic deformation in the semiconductor substrate.

11. The system of claim 1, wherein the force generating unit and/or the detector unit are moveable across a plane parallel to the semiconductor substrate.

12. The system of claim 1, wherein the detector unit is configured to press the probe tip onto the semiconductor substrate with a force of 1000 mN or less.

13. A method for the acoustic detection of cracks in a semiconductor substrate, the method comprising:
   pressing down onto a semiconductor substrate with a force generating unit and thereby applying a force onto the semiconductor substrate;
   contacting the semiconductor substrate with a resonating indenter of a detector unit separate from the force generating unit, the detector unit further comprising an acoustic emission sensor coupled to the resonating indenter; and
   evaluating with an evaluation unit acoustic signals detected by the detector unit and determining, whether a crack has occurred based on the detected signals, wherein the resonating indenter is configured to contact the semiconductor substrate at a lateral distance from the force generating unit, and
wherein the force generating unit and the resonating indenter are configured to contact the semiconductor substrate on the same side.

14. The method of claim 13, wherein the method is performed during electrical testing of the semiconductor substrate, or during wire bonding, or during dicing.

15. The method of claim 13, further comprising:
determining the location of a crack in the semiconductor substrate by using more than one detector units, wherein the more than one detector units contact the semiconductor substrate at different locations.

16. The method of claim 15, further comprising:
determining in which semiconductor device of a plurality of semiconductor devices comprised in the semiconductor substrate the crack occurred.

17. The method of claim 13, wherein due to the size of the lateral distance, the detector unit is sensitive to acoustic signals of cracks but not to acoustic signals of plastic deformations caused by the force generating unit in the semiconductor substrate.

18. The method of claim 13, wherein the lateral distance is 1 cm or more.

* * * * *